(12) United States Patent
Xue

(10) Patent No.: US 11,355,067 B2
(45) Date of Patent: Jun. 7, 2022

(54) ARRAY SUBSTRATE

(71) Applicant: Shenzhen China Star Optoelectronics Semiconductor Display Technology Co., Ltd., Guangdong (CN)

(72) Inventor: Yan Xue, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 352 days.

(21) Appl. No.: 16/608,307

(22) PCT Filed: May 23, 2019

(86) PCT No.: PCT/CN2019/088054
§ 371 (c)(1),
(2) Date: Oct. 25, 2019

(87) PCT Pub. No.: WO2020/215426
PCT Pub. Date: Oct. 29, 2020

(65) Prior Publication Data
US 2021/0358416 A1    Nov. 18, 2021

(30) Foreign Application Priority Data
Apr. 24, 2019    (CN) .......................... 201910334424.4

(51) Int. Cl.
*G09G 3/3266* (2016.01)
(52) U.S. Cl.
CPC ... *G09G 3/3266* (2013.01); *G09G 2300/0814* (2013.01)

(58) Field of Classification Search
CPC .............. G09G 3/3266; G09G 3/3674; G09G 2300/0408; G09G 2300/0814; G09G 2300/0838; G09G 2300/0871; G09G 2310/0286; G09G 2310/0289; G09G 2320/0214; G09G 2320/0223; G09G 2230/00; G11C 19/28
See application file for complete search history.

(56) References Cited

U.S. PATENT DOCUMENTS

| 6,064,364 | A | * | 5/2000 | Katoh ................. G09G 3/3677 345/100 |
| 6,492,840 | B1 | | 12/2002 | Bellaouar |
| 9,824,614 | B2 | * | 11/2017 | Lee ........................ G09G 3/20 |
| 2007/0040786 | A1 | | 2/2007 | Chung |
| 2007/0222737 | A1 | | 9/2007 | Kimura |

(Continued)

FOREIGN PATENT DOCUMENTS

| CN | 1115539 A | 1/1996 |
| CN | 1917016 A | 2/2007 |

(Continued)

*Primary Examiner* — Michael J Eurice
(74) *Attorney, Agent, or Firm* — Taft Stettinius & Hollister LLP

(57) ABSTRACT

An array substrate is provided, which includes a gate driver on array (GOA) circuit and a plurality of logic OR gate units integrated in a rear end of the GOA circuit. The GOA circuit includes a plurality of cascaded GOA units, each of the GOA units includes a scan terminal, and at least three continuously-cascaded GOA units are connected to one of the logic OR gate units through the scan terminals.

9 Claims, 4 Drawing Sheets

(56) References Cited

U.S. PATENT DOCUMENTS

| | | | |
|---|---|---|---|
| 2008/0024418 A1* | 1/2008 | Kim | G09G 3/3648 |
| | | | 345/98 |
| 2012/0293762 A1* | 11/2012 | Shin | G09G 3/3677 |
| | | | 349/139 |
| 2015/0248867 A1* | 9/2015 | Tan | G11C 19/28 |
| | | | 345/100 |
| 2016/0188074 A1* | 6/2016 | Xiao | G06F 3/0412 |
| | | | 345/173 |
| 2016/0259455 A1* | 9/2016 | Li | G06F 3/04164 |
| 2016/0307533 A1* | 10/2016 | Cao | G09G 3/3677 |
| 2017/0047018 A1 | 2/2017 | Park et al. | |
| 2017/0084238 A1* | 3/2017 | Cao | G09G 3/3266 |
| 2017/0103722 A1* | 4/2017 | Song | G11C 19/287 |

FOREIGN PATENT DOCUMENTS

| | | |
|---|---|---|
| CN | 106683606 A | 5/2017 |
| EP | 0973262 A2 | 1/2000 |
| JP | 2000242236 A | 9/2000 |

\* cited by examiner

ARRAY SUBSTRATE

CROSS-REFERENCE TO RELATED APPLICATIONS

This application is a U.S. National Phase Application of International PCT Application No. PCT/CN2019/088054 filed May 23, 2019, which claims the benefit of, and priority to, Chinese Patent Application Serial No. 201910334424.4, which was filed on Apr. 24, 2019, the contents of each application are incorporated herein by reference in their entirety.

FIELD OF INVENTION

The present invention relates to a field of display technologies, and in particular, to an array substrate.

BACKGROUND OF INVENTION

Organic light-emitting diodes (OLED) display device can be classified into two types: passive matrix OLED (PMOLED) and active matrix OLED (AMOLED) according to the driving method. Among them, an AMOLED has pixels arranged in an array, belongs to an active display type, has high luminous efficiency, and is generally used as a high-definition large-sized display device.

At present, large-size AMOELD panel generally adopt an external compensation scheme for the pixels, and the external compensation scheme requires a gate driver on array (GOA) circuit to output an ultra-wide pulse signal (>3 millisecond (ms)). Therefore, in an output stage, a first node (Q) of the GOA circuit needs to maintain a wide pulse width for a long time, and at this time, the node Q is in a floating state. If a leakage current of thin film transistor (TFT) is large, the node Q cannot maintain a high level for a long time, and the GOA circuit cannot output the ultra-wide pulse.

As shown in FIG. 1, when a pulse width of clock period (CK) is 3 ms, the GOA circuit can theoretically output a pulse width of 3 ms, but in fact, the node Q can't maintain high voltage for a long time. Therefore, the GOA circuit cannot output a wide pulse, and at the moment, the actual pulse width of the GOA circuit is 2 ms; and since the pulse width of the GOA circuit is less than 3 ms, a cascaded transmission of the circuit will also fail.

Therefore, a new array substrate needs to be proposed to solve the above problems.

Technical Problem

The invention provides an array substrate, which can facilitates the GOA circuit outputting an ultra-wide pulse in a compensation phase, so as to solve the technical problem that the node Q of array substrate currently cannot maintain high level for a long time due to a large leakage current of TFT and the GOA circuit cannot output the ultra-wide pulse.

SUMMARY OF INVENTION

Technical Solution

In order to solve the above problems, the technical solution provided by the present invention is as follows.

The present invention provides an array substrate, the array substrate includes a gate driver on array (GOA) circuit and a plurality of logic OR gate units integrated in a rear end of the GOA circuit; wherein the GOA circuit includes a plurality of cascaded GOA units, each of the GOA units includes a scan terminal, and at least three continuously-cascaded GOA units are connected to one of the logic OR gate units through the scan terminals.

In an array substrate provided by an embodiment of the present application, an n-th stage of GOA unit outputs an n-th stage scan signal; an (n−1)-th stage scan signal, the n-th stage scan signal, and an (n+1)-th stage scan signal are input signals of an (n−1)-th stage logic OR gate unit; and the n-th stage scan signal, the (n+1)-th stage scan signal, and an (n+2)-th stage scan signal are input signals of an n-th stage logic OR gate unit; where n is a natural number.

In an array substrate provided by an embodiment of the present application, the GOA circuit includes m pieces of the GOA units, and an (m−1)-th stage GOA unit and an m-th stage GOA unit are virtual GOA units, where m is a natural number and greater than n.

In an array substrate provided by an embodiment of the present application, a circuit of the n-th stage logic OR gate unit includes six thin film transistors (TFTs), a first direct current (DC) low voltage input, a second DC low voltage input, a DC high voltage input, a control signal input, and an output of the logic OR gate unit; wherein a gate of a first TFT is connected to the DC high voltage input, and a source and a drain thereof are respectively connected to the output of the n-th stage logic OR gate unit and a gate of a second TFT; a source and a drain of the second TFT are respectively connected to the DC high voltage input and a gate of a third TFT; a source and a drain of the third TFT are respectively connected to the second DC low voltage input and an output of the n-th stage logic OR gate unit; a gate of a fourth TFT is connected to an n-th stage scan terminal, and a source and a drain thereof are respectively connected to the control signal input and the first DC low voltage input; a gate of a fifth TFT is connected to the (n+1)-th stage scan terminal, and a source and a drain thereof are respectively connected to the control signal input and the first DC low voltage input; and a gate of a sixth TFT is connected to an (n+2)-th stage scan terminal, and a source and a drain thereof are respectively connected to the control signal input and the first DC low voltage input.

In an array substrate provided by an embodiment of the present application, when the n-th stage scan terminal is a high level, the fourth TFT is turned on, and when the control signal input is a low level, the third TFT is turned off, the first TFT is turned on, and the output of the n-th stage logic OR gate unit outputs a high level.

In an array substrate provided by an embodiment of the present application, when the n-th stage scan terminal is a low level and the (n+1)-th stage scan terminal is a high level, the fourth TFT is turned off, and when the control signal input is a low level, the third TFT is turned off, the first TFT is turned on, and the output of the n-th stage logic OR gate unit outputs a high level.

In an array substrate provided by an embodiment of the present application, when the (n+1)-th stage scan terminal is a low level and the (n+2)-th stage scan terminal is a high level, the sixth TFT is turned on and the fifth TFT is turned off, the control signal input is a low level, and the output of the n-th stage logic OR gate unit outputs a high level.

In an array substrate provided by an embodiment of the present application, when the (n+2)-th stage scan terminal is a low level, the sixth TFT is turned off, and when the control signal input is a high level, the third TFT is turned on, and the output of the n-th stage logic OR gate unit outputs a low level.

In an array substrate provided by an embodiment of the present application, a voltage of the second DC low voltage input is greater than a voltage of the first DC low voltage input.

In an array substrate provided by an embodiment of the present application, the GOA circuit is made of an indium gallium zinc oxide (IGZO)material.

Beneficial Effect

The beneficial effect of the present invention is that the array substrate of the present invention includes a GOA circuit and a plurality of logic OR gate units integrated in a rear end of the GOA circuit, wherein the GOA circuit includes a plurality of cascaded GOA units, each of the GOA units includes a scan terminal, and at least three cascaded GOA units are connected to one of the logic OR gate units through the scan terminals. When the circuit is in operation, at least three cascaded GOA units can be successively raised to a high level, so that the output signal terminal of the logic OR gate unit can maintain a high level for a longer time. The array substrate of the invention can reduce the outputting pulse width of the GOA circuit, and the reduction of the pulse width can reduce the leakage current of the first node (Q), and is favorable for obtaining a stable GOA circuit outputting signal, and the GOA circuit can be normally cascaded at the same time.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF EMBODIMENTS

Figure 1:
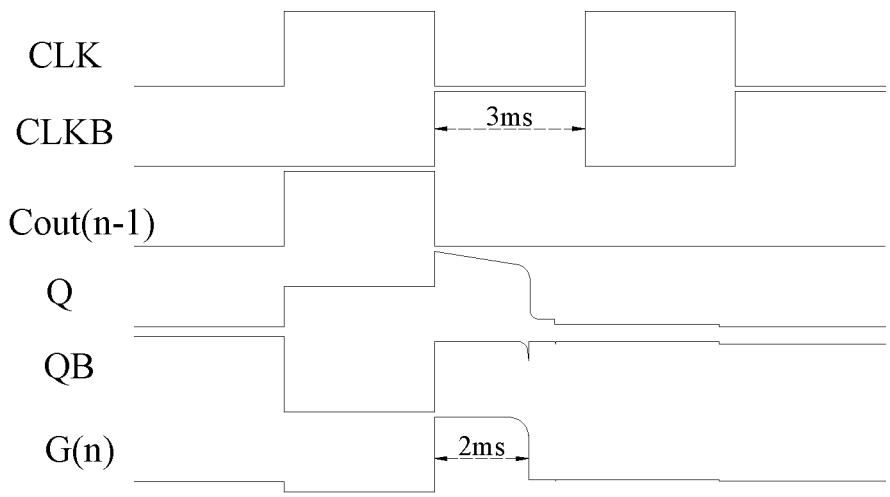
FIG. 1 is a signal waveform diagram of a current array substrate.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

The present embodiment can solve the technical problem that a node Q of array substrate currently cannot maintain high level for a long time due to a large leakage current of thin film transistor (TFT), and a gate driver on array (GOA) circuit cannot output the ultra-wide pulse.

Figure 2:
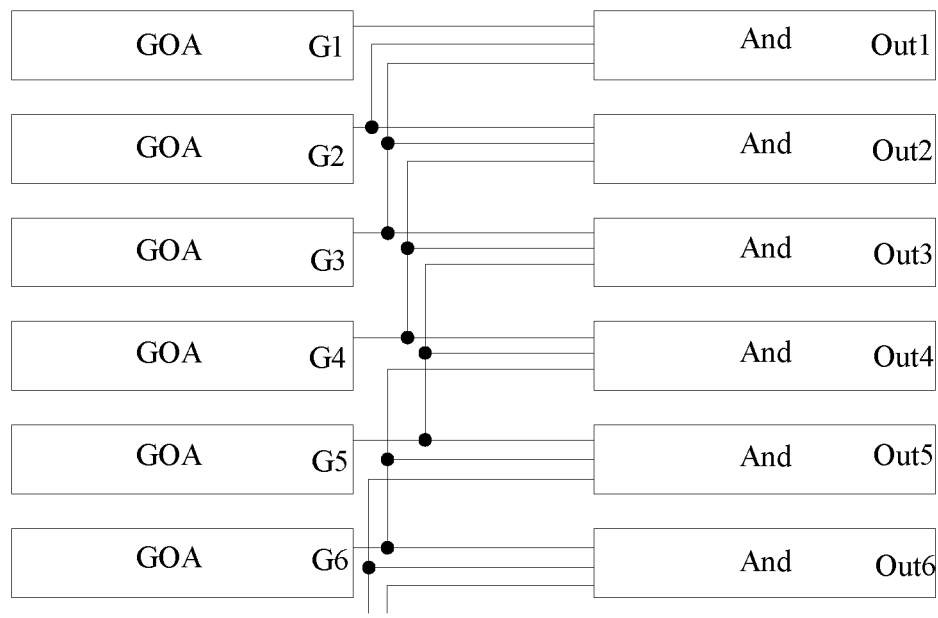
FIG. 2 is a schematic structural diagram showing an array substrate according to an embodiment of the present invention.

As shown in FIG. 2, the present invention provides an array substrate, the array substrate includes a GOA circuit and a plurality of logic OR gate units integrated in a rear end of the GOA circuit, wherein the GOA circuit includes a plurality of cascaded GOA units, each of the GOA units includes a scan terminal, and at least three cascaded GOA units are connected to one of the logic OR gate units through the scan terminals.

For example, if a 3 millisecond (ms) pulse width needs to be obtained, the 3 ms pulse width can be obtained through a multi-level GOA unit access a logic OR gate unit, and the outputting pulse width of the last GOA circuit can be reduced to 1 ms.

In other embodiments, the number of GOA units connected to the logic OR gate unit can be more. When the number of GOA units connected to the logic OR gate unit is larger, the pulse width of the GOA circuit can be reduced. The reduction of the pulse width of the GOA circuit is beneficial to reduce the leakage current of the node Q. The reduction of the leakage current of the node Q can obtain a stable GOA circuit outputting signal, and ensure the normal transmission of the GOA circuit at the same time.

Let n be a natural number, and an n-th stage GOA unit outputs an n-th stage scan signal; an (n−1)-th stage scan signal, the n-th stage scan signal, and an (n+1)-th stage scan signal are input signals of an (n−1)-th stage logic OR gate unit; the n-th stage scan signal, the (n+1)-th stage scan signal, and an (n+2)-th stage scan signal are input signals of an n-th stage logic OR gate unit.

Let m be a natural number, the GOA circuit includes m pieces of the GOA unit (m>n), and an (m−1)-th stage GOA unit and an m-th stage GOA unit are virtual GOA units. The last two stages of GOA units are virtual GOA units, which provides feedback signals for the upper stage GOA unit and provides the signal source for the last stage of the logic OR gate unit.

In other embodiments, for example, four of the GOA units are connected to one of the logic OR gate units, and an (m−2)-th, an (m−1)-th stage, and an m-th stage are virtual GOA units. The last two stages of GOA units are virtual GOA units, which provides a feedback signal for the upper stage GOA unit and simultaneously provides a signal source for the last stage of the logic OR gate unit. If the access of GOA unit is 5 or more, all by analogy with this rule.

Figure 3:
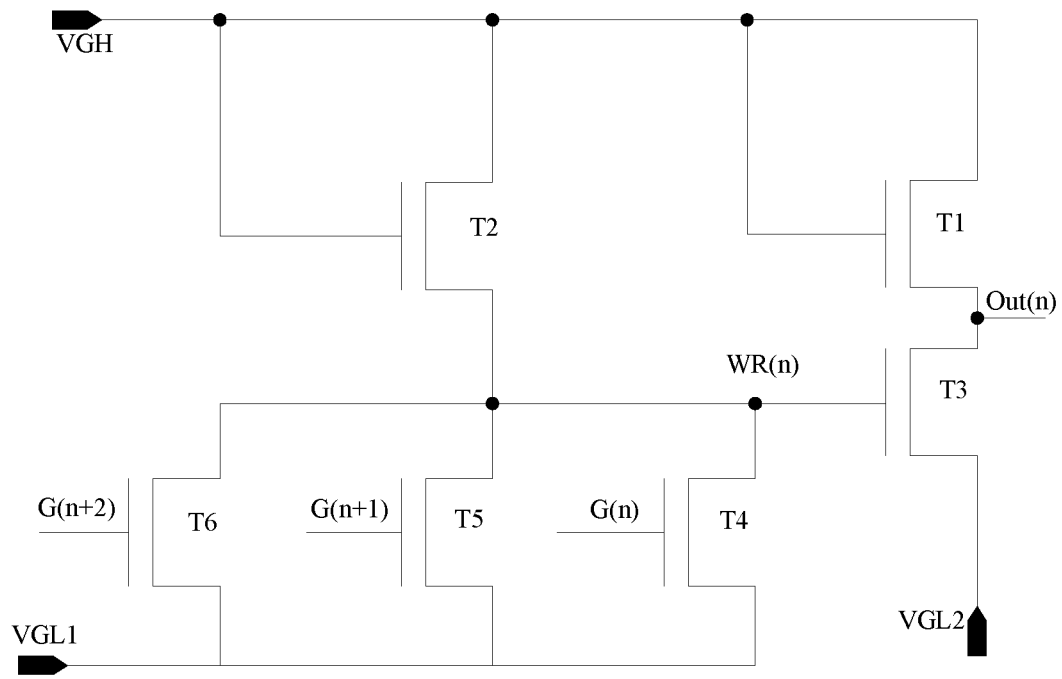
FIG. 3 is a schematic circuit diagram of an array substrate according to an embodiment of the present invention.

FIG. 3 is a logic OR gate circuit diagram of the present invention. A circuit of an n-th stage logic OR gate unit includes six TFTs, a first direct current (DC) low voltage input VGL1, a second DC low voltage input VGL2, a DC high voltage input VGH, a WR control signal input, and an output of the n-th logic OR gate unit Out(n). Wherein a gate of a first TFT T1 is connected to the DC high voltage input, and a source and a drain thereof are respectively connected to the output of the n-th stage logic OR gate unit and a gate of a second TFT T2. A source and a drain of the second TFT T2 are respectively connected to the DC high voltage input and a gate of a third TFT T3. A source and a drain of the third TFT T3 are respectively connected to the second DC low voltage input and an output of the n-th stage logic OR gate unit. A gate of a fourth TFT T4 is connected to an n-th stage scan terminal, and a source and a drain thereof are respectively connected to the control signal input and the first DC low voltage input. A gate of a fifth TFT T5 is connected to the (n+1)-th stage scan terminal, and a source and a drain thereof are respectively connected to the control signal input and the first DC low voltage input. A gate of a sixth TFT T6 is connected to an (n+2)-th stage scan terminal, and a source and a drain thereof are respectively connected to the control signal input and the first DC low voltage input.

Wherein T4, T5, T6 are connected to scan terminals of the GOA units of the n-th stage, the (n+1)-th stage, and the (n+2)-th stage. The WR control signal is an internal control signal in a circuit of logic OR gate unit.

Figure 4:
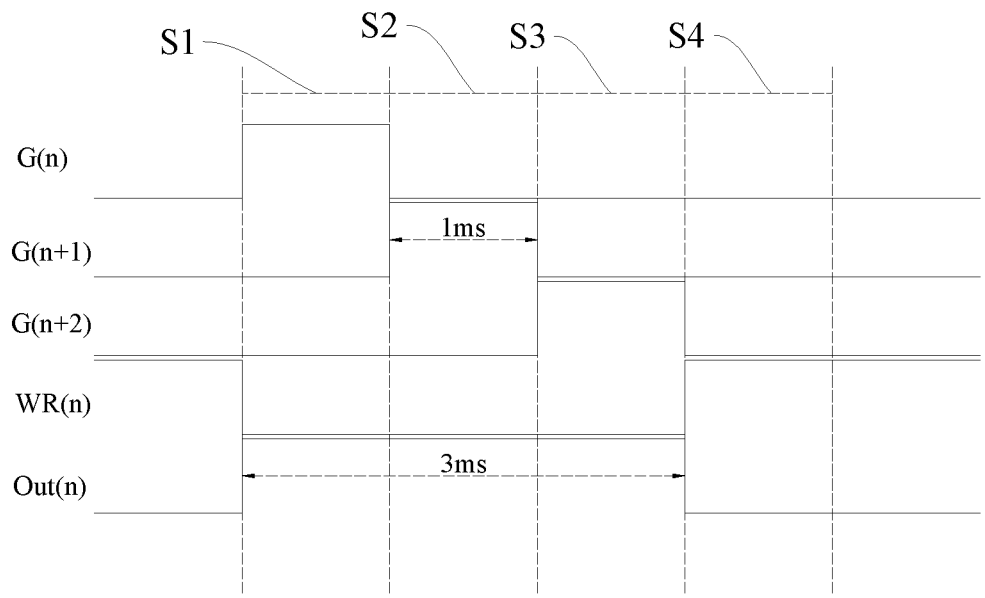
FIG. 4 is a signal waveform diagram of an array substrate according to an embodiment of the present invention.

FIG. 4 is a signal waveform diagram of an n-th stage logic OR gate unit of the present invention, and the operation process of the n-th stage logic OR gate unit with wide pulse can be divided into four stages.

In the S1 stage, when the n-th stage scan terminal is raised to a high level, the fourth TFT is opened, and the WR control signal input is a low level, the third TFT is closed, and the first TFT is opened, and the output of the n-th stage logic OR gate unit outputs a high level.

In the S2 stage, when the n-th stage scan terminal is lowered to a low level, the (n+1)-th stage scan terminal is a high level, the fifth TFT is turned on, the fourth TFT is turned off, the WR control signal input is a low level, and the output of the n-th stage logic OR gate unit outputs a high level.

In the S3 stage: when (n+1)-th stage scan terminal is lowered to a low level, the (n+2)-th stage scan terminal is a high level, the sixth TFT is turned on, the fifth TFT is turned off, the WR control signal input is a low level, and the output of the n-th stage logic OR gate unit outputs a high level.

In the S4 stage: when the (n+2)-th stage scan terminal is lowered to a low level, the sixth TFT is turned off, the WR control signal input is high level, the third TFT is turned on, and the output of the n-th stage logic OR gate unit outputs a low level.

Through the above logic OR gate unit, the pulse width of the GOA circuit can be increased from 1 ms to 3 ms.

Figure 5:
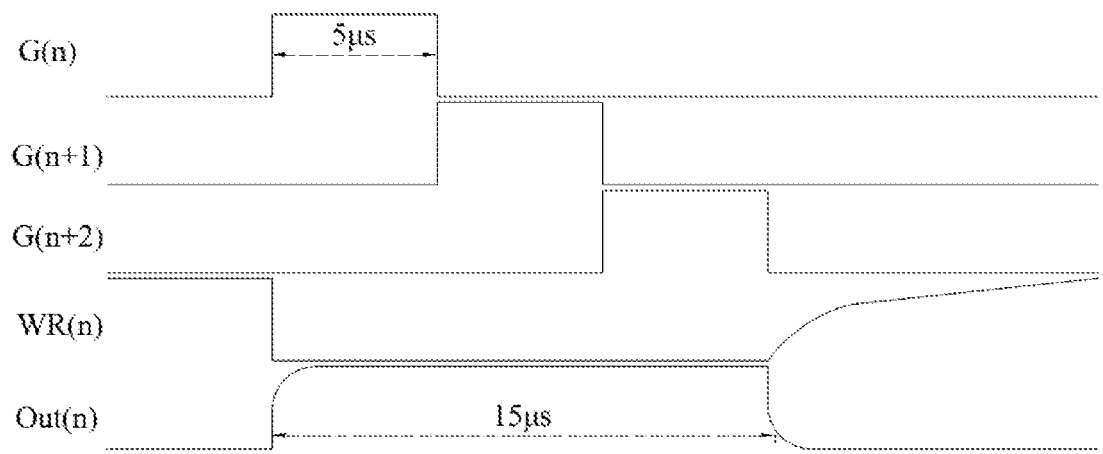
FIG. 5 is a signal waveform diagram showing a narrow pulse output of an array substrate according to an embodiment of the present invention.

In the programming phase of the GOA circuit, the GOA does not need to output a wide pulse, and can also output a narrow pulse by using the structure of the present invention. As shown in FIG. 5, it is a signal waveform diagram of a narrow pulse output of the array substrate of the present invention. The operation of the GOA circuit of the array substrate during outputting a narrow pulse is the same as outputting a wide pulse. The logic OR gate unit can increase the pulse width of the GOA circuit from 5 microsecond (μs) to 15 μs.

Figure 6:
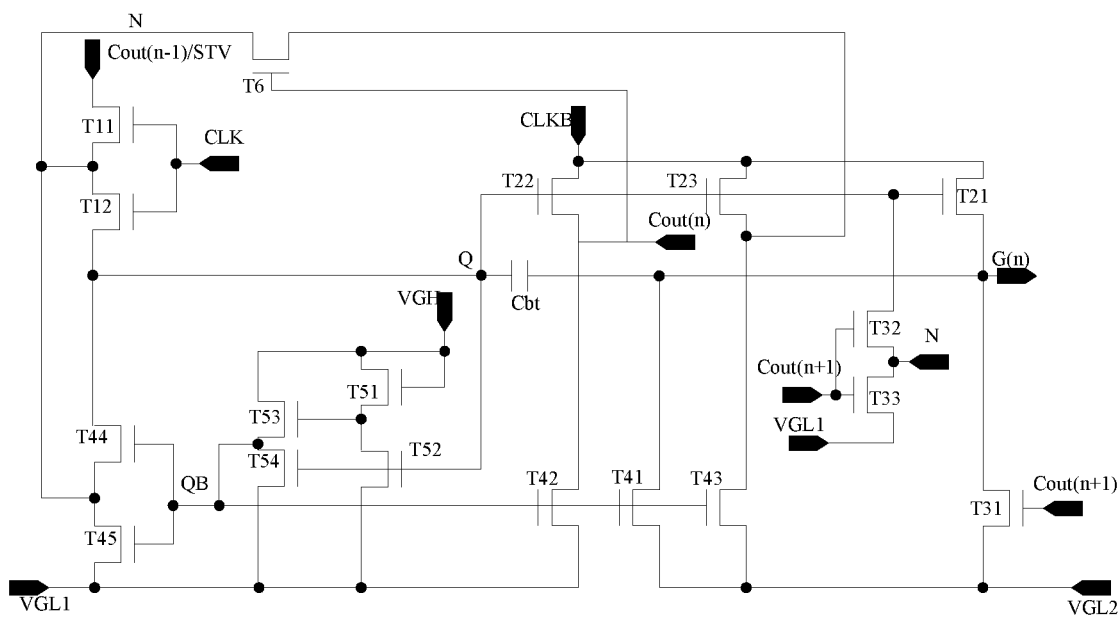
FIG. 6 is a schematic circuit diagram showing a 31-st stage gate driver on array (GOA) unit of an array substrate according to an embodiment of the present invention.
Figure 7:
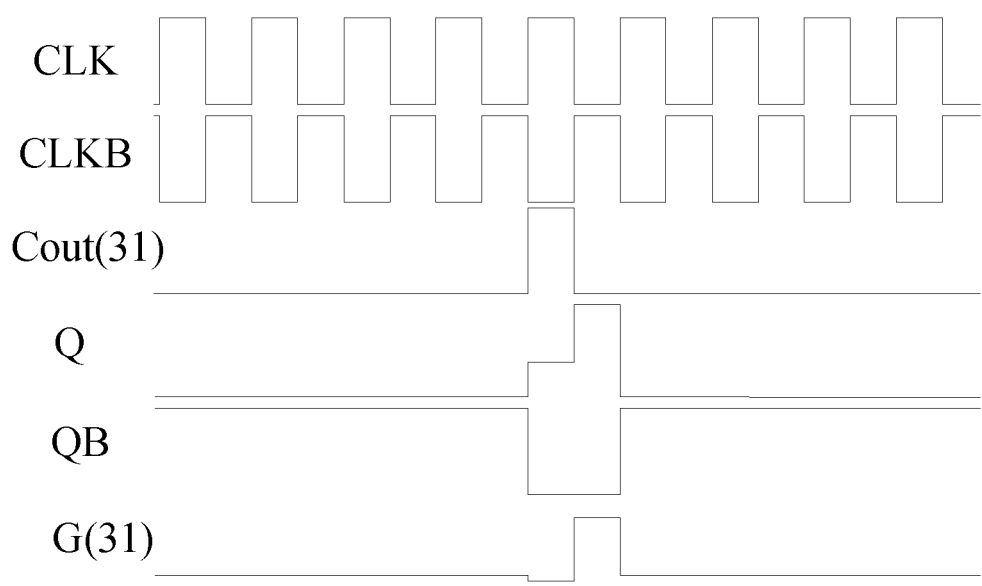
FIG. 7 is a signal waveform diagram of a 31-st stage GOA unit of an array substrate according to an embodiment of the present invention.

As shown in FIG. 6 and FIG. 7, one is a circuit diagram and another is a signal waveform diagram of a 31-st stage GOA unit (G31).

The 31-st stage GOA unit is composed of 18 TFTs and a capacitor Cbt, wherein a CLK terminal and a CLKB terminal are alternating current (AC) power supply terminals with opposite waveforms, a VGH terminal, a VGL1 terminal, and a VGL2 terminal are DC power supply inputs, and a STV terminal is a start pulse trigger signal input configured to start the first stage GOA unit. Nodes N, Q, QB, Cout(n−1), Cout(n), Cout(n+1), G(n), and the like are important nodes in the circuit.

The CLKB is a first clock signal, the CLK is a second clock signal, the Cout(n−1) terminal is an output of previous stage cascaded signal, the G(n) terminal is an output of the n-th stage scan signal, the Q is the first node, the N is the third node, and the QB is the fourth node.

The 18 TFTs in the 31-st stage GOA unit are divided according to the functions. A T11 and a T12 are belong to a pull-up control module, a T21, a T22 and a T23 are belong to a pull-up module, a T31, a T32, and a T33 are belong to a pull-down module, T41-T45 are belong to a pull-down maintenance module, T51-T54 are belongs to the inverter module, and a T6 is a feedback module. Taking the 31-th GOA unit as an example, the following describes the specific operation process of the GOA circuit.

When the Cout(30) terminal is a high level, the CLK terminal is at high level at the same time, the T11 and the T22 are turned on, high level the Cout(30) terminal is transmitted to the node Q, the node Q is a high level, the T21, the T22, and the T23 are turned on at the same time. Because an inverter structure is connected between the node Q and the node QB, the potential between them is opposite, therefore, the node QB is at a low level, the T41, the T42, the T43, the T44, and the T45 are turned off, the Cout(32) terminal is at a low level, the T31, the T32, and the T33 are turned off, the CLKB terminal is at a low level, outputs of the Cout(n) terminal and the G(n) terminal are low level.

Then, the Cout(30) terminal and the CLK terminal are at a low level, the T11 and the T12 are turned off. At this time, node Q is capacitively coupled and raised to a higher potential, the T31, the T32, the T33, the T41, the T42, the T43, the T44, and the T45 are continue to turned off. The CLKB terminal is at a high level, at this time the Cout(31) terminal and the G(31) terminal are high level. At this time, the T6 is turned on, and the node N is at a high level, and the potential lowers the leakage current of the T12, the T44, and the T32. It should be noted that we introduce two VGL lines, where VGL2>VGL1, such that Vgs<0, reduces the risk of leakage current when a Vth of the T31, the T41, the T43, and the T6 are negative. In addition, during the 168 ms potential maintenance phase, the node Q potential is not reduced, indicating that the circuit can effectively solve the node Q potential maintenance problem.

Subsequently, the CLK terminal rises to a high level, the Cout(30) terminal is at a low level, and the Cout(32) terminal is at a high level, the T11, the T12, the T31, the T32, and the T33 are turned on, and the node Q potential is rapidly pulled down. At this time, the node QB potential is pulled to a high level, the T41, the T42, the T43, the T44, and the T45 are turned on, and the Cout(31) terminal and the G(31) terminal are pulled down to low level VGL1 and VGL2 respectively.

The final output of the GOA unit is the scan signal G(n), and each GOA unit accesses the plurality of logic OR gate units through the scan terminals to provide an input signal to the logic OR gate unit.

The beneficial effect of the present invention is that the array substrate of the present invention includes a GOA circuit and a plurality of logic OR gate units integrated in a rear end of the GOA circuit, wherein the GOA circuit includes a plurality of cascaded GOA units, each of the GOA units includes a scan terminal, and at least three cascaded GOA units are connected to one of the logic OR gate units through the scan terminals. When the circuit is in operation, at least three cascaded GOA units can be successively raised to a high level, so that the output signal terminal of the logic OR gate unit can maintain a high level for a longer time. The array substrate of the invention can reduce the outputting pulse width of the GOA circuit, and the reduction of the pulse width can reduce the leakage current of the first node (Q), and is favorable for obtaining a stable GOA circuit outputting signal, and the GOA circuit can be normally cascaded at the same time.

Embodiments of the present invention have been described, but not intending to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An array substrate comprising a gate driver on array (GOA) circuit and a plurality of logic OR gate units integrated in a rear end of the GOA circuit; wherein the GOA circuit comprises a plurality of cascaded GOA units, each of the GOA units comprises a scan terminal for outputting a corresponding scan signal, and at least three continuously-cascaded GOA units are connected to a same logic OR gate unit of the logic OR gate units through the scan terminals,
wherein an n-th stage of GOA unit outputs an n-th stage scan signal, where n is a natural number,
wherein a circuit of an n-th stage logic OR gate unit comprises six thin film transistors (TFTs), a first direct current (DC) low voltage input, a second DC low voltage input, a DC high voltage input, a control signal input, and an output of the n-th stage logic OR gate unit; and
wherein a gate of a first TFT is connected to the DC high voltage input, and a drain and a source thereof are respectively connected to the output of the n-th stage logic OR gate unit and a gate of a second TFT;
a source and a drain of the second TFT are respectively connected to the DC high voltage input and a gate of a third TFT;
a drain and a source of the third TFT are respectively connected to the second DC low voltage input and the output of the n-th stage logic OR gate unit;
a gate of a fourth TFT is connected to an n-th stage scan terminal, and a source and a drain thereof are respectively connected to the control signal input and the first DC low voltage input;
a gate of a fifth TFT is connected to an (n+1)-th stage scan terminal, and a source and a drain thereof are respectively connected to the control signal input and the first DC low voltage input; and
a gate of a sixth TFT is connected to an (n+2)-th stage scan terminal, and a source and a drain thereof are respectively connected to the control signal input and the first DC low voltage input.

2. The array substrate according to claim 1, wherein an (n−1)-th stage scan signal, the n-th stage scan signal, and an (n+1)-th stage scan signal are input signals of an (n−1)-th stage logic OR gate unit; and the n-th stage scan signal, the (n+1)-th stage scan signal, and an (n+2)-th stage scan signal are input signals of the n-th stage logic OR gate unit.

3. The array substrate according to claim 1, wherein the GOA circuit comprises m pieces of the GOA units, and an (m−1)-th stage GOA unit and an m-th stage GOA unit are virtual GOA units, where m is a natural number and greater than n.

4. The array substrate according to claim 1, wherein when the n-th stage scan terminal is a high level, the fourth TFT is turned on, and when the control signal input is a low level, the third TFT is turned off, the first TFT is turned on, and the output of the n-th stage logic OR gate unit outputs a high level.

5. The array substrate according to claim 1, wherein when the n-th stage scan terminal is a low level and the (n+1)-th stage scan terminal is a high level, the fourth TFT is turned off, and when the control signal input is a low level, the third TFT is turned off, the first TFT is turned on, and the output of the n-th stage logic OR gate unit outputs a high level.

6. The array substrate according to claim 1, wherein when the (n+1)-th stage scan terminal is a low level and the (n+2)-th stage scan terminal is a high level, the sixth TFT is turned on and the fifth TFT is turned off, the control signal input is a low level, and the output of the n-th stage logic OR gate unit outputs a high level.

7. The array substrate according to claim 1, wherein when the (n+2)-th stage scan terminal is a low level, the sixth TFT is turned off, and when the control signal input is a high level, the third TFT is turned on, and the output of the n-th stage logic OR gate unit outputs a low level.

8. The array substrate according to claim 1, wherein a voltage of the second DC low voltage input is greater than a voltage of the first DC low voltage input.

9. The array substrate according to claim 1, wherein the GOA circuit is made of an indium gallium zinc oxide (IGZO) material.

* * * * *